United States Patent [19]

Hughes, Jr.

[11] Patent Number: 4,493,045
[45] Date of Patent: Jan. 8, 1985

[54] TEST VECTOR INDEXING METHOD AND APPARATUS

[75] Inventor: John H. Hughes, Jr., Cohoes, N.Y.

[73] Assignee: Fairchild Camera & Instrument Corp., Mountain View, Calif.

[21] Appl. No.: 312,839

[22] Filed: Oct. 19, 1981

[51] Int. Cl.³ .................... G05B 19/02; G05B 23/02
[52] U.S. Cl. ................... 364/580; 364/488;
364/490; 364/550; 364/551; 364/579; 371/19;
371/27
[58] Field of Search ............. 364/580, 480, 481, 488,
364/490, 550, 551, 579, 200; 324/73 R, 73 AT;
371/27, 19

[56] References Cited

U.S. PATENT DOCUMENTS

| | | | |
|---|---|---|---|
| 3,634,883 | 1/1972 | Kreidermacher | 340/172.5 |
| 4,008,462 | 2/1977 | Kanda | 340/172.5 |
| 4,038,643 | 7/1977 | Kim | 364/200 |
| 4,070,565 | 1/1978 | Borrelli | 364/580 |
| 4,091,446 | 5/1978 | Demonte et al. | 364/200 |
| 4,287,594 | 9/1981 | Shirasaka | 371/27 |
| 4,293,950 | 10/1981 | Shimizu et al. | 371/27 |
| 4,307,445 | 12/1981 | Tredennick et al. | 364/200 |
| 4,397,021 | 8/1983 | Lloyd et al. | 364/580 |

Primary Examiner—Errol A. Krass
Assistant Examiner—C. Tager
Attorney, Agent, or Firm—Randall J. Gort

[57] ABSTRACT

A data channel for a digital tester includes a random access local memory containing a main vector sequence, a subroutine vector sequence, and a test vector list. An index register is loaded with the address of the first vector in the list of vectors that is to be inserted as a variable into a vector stream. A sequence instruction selects the index register as the source of a test vector address when a variable vector is to be inserted into the vector stream at a point in a subroutine. The sequence instruction also resets the index register to a state which determines the address of the next variable to be inserted into the test vector pattern.

11 Claims, 4 Drawing Figures

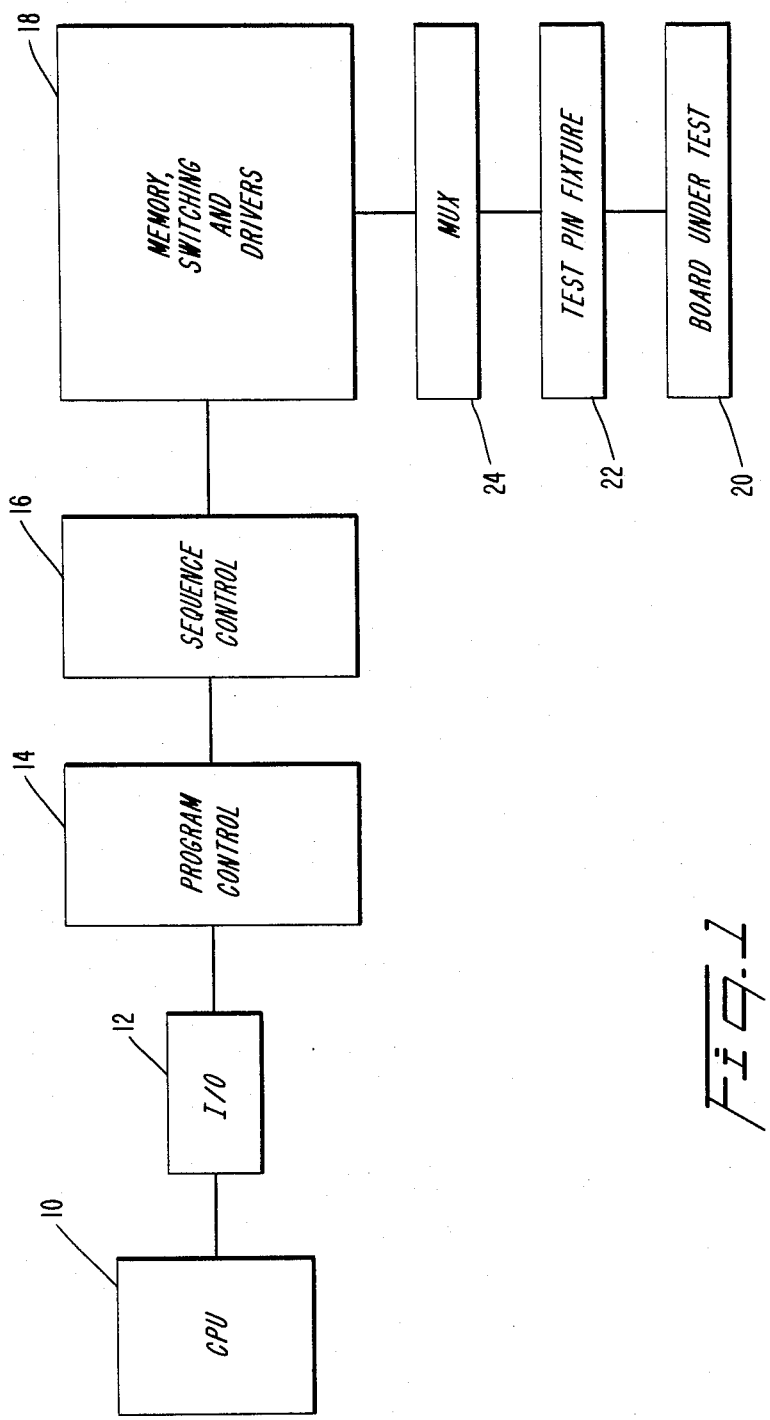

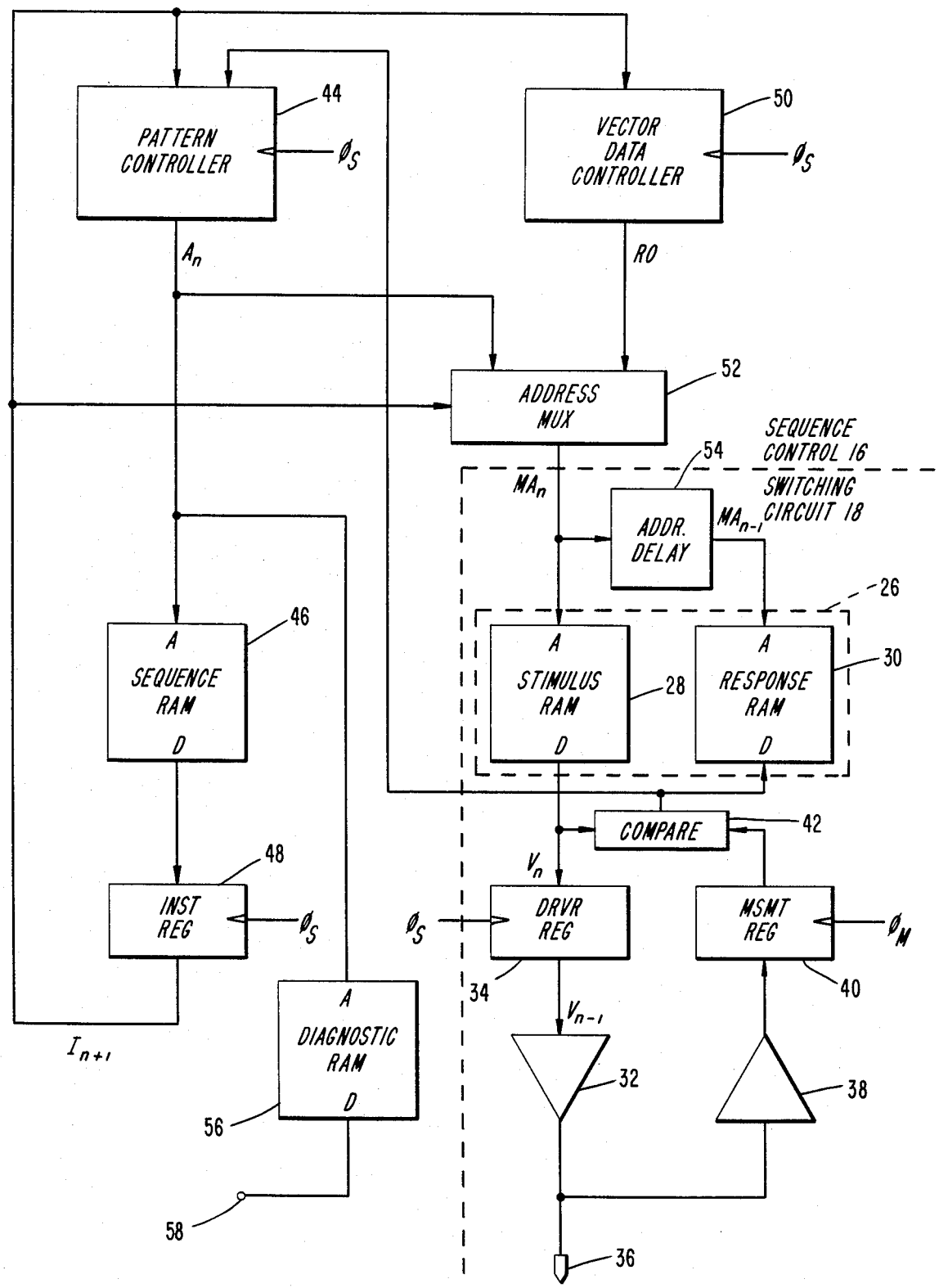

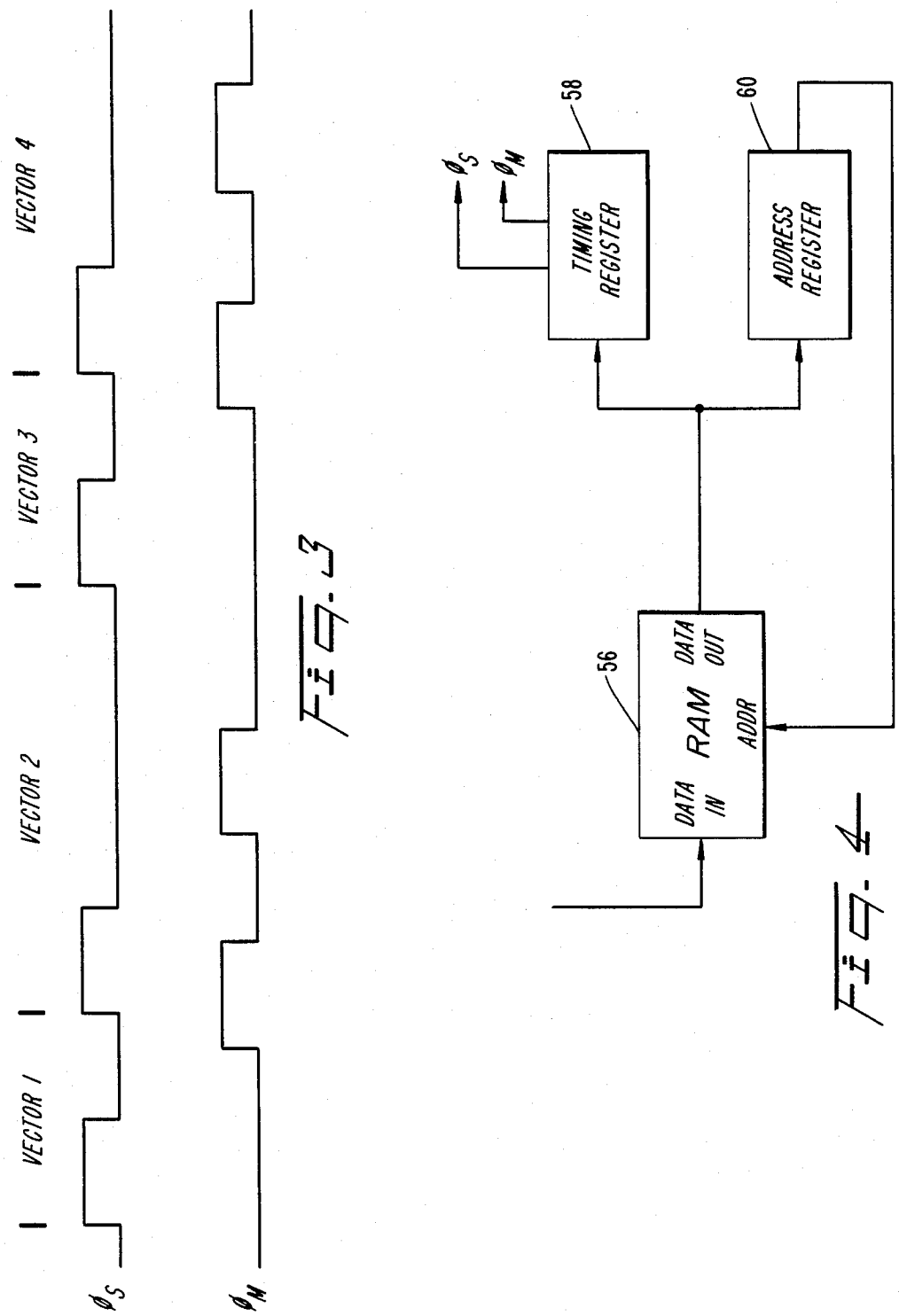

TEST VECTOR INDEXING METHOD AND APPARATUS

BACKGROUND OF THE INVENTION

The present invention relates to a system for storing and retrieving digital information, and more particularly to a system for compressing the amount of digital information that is stored in a local data channel memory for a digital tester to thereby decrease the amount of storage space required to provide for a thorough exercising of an electronic component.

In a digital tester such as an in-circuit/functional electronic component tester of the type disclosed in U.S. Pat. No. 3,870,953, test vectors are generated in a central control computer and eventually applied to various nodes on a printed circuit board to cause an electronic component on the board, such as an integrated circuit chip, to produce response signals at other nodes. The response signals produced by the component under test are compared with expected responses to determine whether the component is functioning properly. The nature of the test vectors that are applied to the nodes as stimulus signals is such that they do not harm other components on the circuit board but they drive the node of the circuit under test sufficiently to overcome the influence of other components that might be connected to that node. In other digital testers for testing electronic components that are not connected to other circuits, e.g. individual IC's, or for functionally testing entire circuit boards through edge connectors, stimulus signals are similarly applied and responses are similarly measured, but the problems of harming other components and overcoming other signal levels are not present.

A typical digital tester might have over 500 individual data channels through which stimulus signals are applied to the circuit board and response signals are received. In order to increase the rate at which the test vectors are applied to the circuit board, each data channel has its own local memory that is loaded with the test vectors generated in the central computer at the initiation of a test procedure. The local memories can apply the test vectors to the circuit board at a much faster rate than they can be generated by the computer, as well as independently of one another, to thereby substantially decrease the time it takes to thoroughly exercise all of the electronic components on the circuit board.

As the state of microelectronics advances and integrated circuits evolve from small scale to large scale and very large scale devices, the length of a test pattern, i.e., the number of test vectors, required to thoroughly check a component increases substantially, and taxes the limits of the local memory for each data channel. This problem is particularly acute in testers which utilize shift registers to implement the local memory for each data channel. Once the contents of the memory has been shifted out of the registers, it must be reloaded with new test vectors before the test procedure can resume. The time it takes to load information into a local memory plays a significant role in the overall rate at which a device can be tested, and hence the need to reload during a test substantially reduces the total efficiency of the test procedure. In addition, another problem associated with the shift register type memories is the fact that once a test vector is shifted out of the memory, it cannot be reused until it has been reloaded into the memory and shifted through all of its stages.

In an effort to overcome the problems associated with shift register type memories, other testers utilize random access (RAM) type memories to store the data channel information. This implementation allows the test vectors to be applied to the nodes on the circuit board by addressing predetermined locations within the memory, and hence allows test vectors to be reused since they are not "lost" when they are read out of the memory. In addition, random access memories enable subroutines and looping instructions to be utilized to recall stored test vectors, so that it is not necessary to allocate one memory location for each cycle in the test procedure, thereby providing a measure of test data compression. However, one drawback associated with prior art random access type memories is the fact that they are not capable of accessing variable data when executing a sequence in the test procedure. In other words, once the test vectors are loaded from the central control computer into the RAMs, the data is fixed and the sequence of test vectors cannot be modified in response to different types of output signals from the circuit being tested.

One type of memory system that attempts to overcome this problem is disclosed in an article entitled "Compressing Test Patterns To Fit Into LSI Testers" by Trent Cave, *Electronics* Magazine, Oct. 12, 1978, pages 136–140. The local memory system disclosed therein utilizes both a random access memory and a shift register to store the test vectors for the data channel. Test pattern vectors are loaded into the RAM and are addressed with a test pattern controller. The shift register is loaded with variable data that can be inserted into the test pattern, for example between subroutines or loops executed with the RAM, in a first-in, first-out manner.

Although this dual memory approach enables variable data to be inserted into a test pattern stored within a random access memory, it still suffers from the drawbacks associated with shift register memories. Specifically, once a variable in the test vector has been shifted out of the shift register memory, it cannot be reused until it has been reloaded into the memory. The need to reload the shift register each time a new variable is to be inserted into the test pattern continues to play a significant role in the overall throughput capabilities of the tester.

Accordingly, it is a general object of the present invention to provide a novel system for compressing test vector information stored in the local memory of a digital tester.

It is another object of the present invention to provide a novel data channel memory system that does not require the use of shift registers to insert variables into the test pattern.

It is yet another object of the present invention to provide a novel local memory system that allows a test vector variable to be reused without having to restore it prior to each reuse thereof.

It is a further object of the present invention to utilize a random access type memory to store both fixed and variable test vectors, and to provide a source of address information for accessing the variables stored in the memory when they are required to be inserted in a test pattern.

SUMMARY OF THE INVENTION

These and other objects and advantages are achieved in accordance with the present invention by injecting variables into subroutines read from the random access memory by means of an index test vector list. The test vector list is stored in the random access memory separate from both the main vector sequence and any subroutine vector sequences. Prior to entering a subroutine sequence, an index register is loaded with the address of the first statement in the vector list that is to be inserted into the vector data. At the point in the subroutine where the variable vector is to be inserted, a vector data controller instruction selects the index register, instead of a pattern controller, as the source of the test vector address. Instruction from the vector data controller also includes information which controls the next state of the index register after execution of the instruction. This information allows the index register to either maintain its current value, increment or decrement by one, or be loaded with an entirely new value.

A more thorough appreciation of the invention and its advantages can be obtained with reference to the following detailed description of a preferred embodiment of the invention illustrated in the accompanying drawings.

BRIEF DESCRIPTION OF THE DRAWINGS

FIG. 1 is a block circuit diagram of the general layout of an in-circuit digital tester;

FIG. 2 is a block circuit diagram of the portions of a sequence control circuit and a switching circuit that implement the present invention;

FIG. 3 is a timing diagram illustrating the variation in the clocking signals that are applied to the various sequencing control registers under different testing conditions; and FIG. 4 is a block circuit diagram of a timing circuit that can be used to provide variable timing control.

DETAILED DESCRIPTION

The preferred embodiment of the invention is described hereinafter with particular reference to its implementation in an in-circuit digital tester. It will be appreciated by those of ordinary skill in the art, however, that the invention has more general applicability. Specifically, it can be successfully utilized in any type of digital tester that includes a memory unit for storing test vectors that are to be applied as stimulus signals to a component, including functional and individual component testers, for example.

An in-circuit digital tester of the type to which the present invention applies is illustrated in block diagram form in FIG. 1. Operation of the tester is generally controlled by a control computer, or central processing unit, 10 that performs such functions as generating test vectors to be applied to the components to be tested, evaluating the responses of the components to a set of applied signals, and programming the general sequence and timing of the test signals. An input/output interface circuit 12 connects the control computer 10 with a program control circuit 14 and a sequence control circuit 16. The program control and sequence control circuits 14 and 16 receive data and timing signals generated by the control computer 10 and generate additional timing and address signals to route data into appropriate memory units within a switching circuit 18 that also contains control switches and drive circuits. The program control and sequence control circuits 14 and 16 also generate timing signals that are applied to the various switches within the switching circuit 18.

The switching circuit 18 comprises a multiplicity of data channels, each of which includes a local memory, one or more control switches, and a driver/detector pair. Information is exchanged between the switching circuit 18 and a circuit board 20 under test by means of a test pin fixture 22 that connects the data channels in the switching circuit with nodes on the circuit board. The test pin fixture 22 can be, for example, a bed of nails type fixture that comprises an array of spring loaded pins that contact the nodes on the board 20. Where the number of pins on the fixture 22 is greater than the number of data channels in the switching circuit 18, the data channels can be selectively connected to various ones of the pins through a suitable multiplexing unit 24.

In operation, the local memories within the switching circuit 18 are loaded with test vectors to be applied to the various nodes on the board during a test procedure. These test vectors are generated within the control computer 10 and routed to appropriate memories through the program control and sequence control circuits 14 and 16. After the memories are loaded, they are selectively connected to the drivers of the data channels through the control switches in the switching circuit 18, to apply stimulus signals to the nodes of the circuit board 20. The response of the components on the board to the applied stimulus signals is compared with an expected result to determine whether the components are operating properly. This comparison can be performed within the switching circuit 18 for each individual data channel, or alternatively can be carried out within the program control circuit 14 or the control computer 10.

A more detailed block circuit diagram of the portions of a sequence control circuit 16 and a switching circuit 18 that implement the present invention appears in FIG. 2. Each data channel in the switching circuit 18 includes a local memory 26 that comprises a stimulus RAM 28 and a response RAM 30. The stimulus RAM 28 is loaded with test vectors representing a sequence of main stimulus signals, expected response signals, and subroutines of vector signals to be applied to a node of a circuit board under test. The stimulus RAM 28 also contains a list of vectors representing variables to be inserted into the sequence of stimulus signals.

The stimulus RAM 28 is connected to a driver 32 by means of a driver register 34 that receives the test vector information stored at an addressed location of the stimulus RAM 28 and applies a suitable current vector signal to the driver 32 in response to a clock pulse $\Phi_r$. The driver 32 in turn applies an appropriate current or voltage signal to a test pin 36 that is connected to one of the nodes on the circuit board under test. The test pin 36 is also connected to a receiver 38 which applies any response signals received at the test pin 36 to a measurement register 40. The measured results in the register 40 are compared with expected results stored in the stimulus RAM 28, for example in a suitable comparator 42. The results of the comparison are stored in the response RAM 30.

Address signals to be applied to the stimulus and response RAMs 28 and 30 are generated in a pattern controller 44. The pattern controller can be any suitable conventional device for generating address signals A in response to applied instruction signals I, such as a 2910 sequencer, for example. The instruction signals I that are applied to the pattern controller 44 are stored in a sequence instruction RAM 46 that receives the address signals A generated by the controller 44. The instruction signal that is read from the sequence RAM 46 in response to an address signal is stored in an instruction register 48 during the clock period in which the preceding instruction is applied to the pattern controller 44.

The instruction signals I from the RAM 46 are also applied as input signals to a vector data controller 50 that produces address signals RO relating to variables that are to be inserted into the sequence of test pattern vectors being generated by the stimulus RAM 28 in response to the address signals A from the pattern controller 44. The vector data controller 50 can be any suitable conventional type of indexable register, such as a 2901A register, for example. The address signals A and RO from both the pattern controller 44 and the vector data controller 50 are fed to an address multiplexer 52. In response to the sequence instruction I from the sequence RAM 46, the address multiplexer 52 selectively applies either the output signal A or RO from the pattern controller 44 or from the vector data controller 50 as an address signal MA to the stimulus and response RAMs 28 and 30.

In operation, upon the occurrence of a clock pulse $\phi_s$, the pattern controller 44 produces an address signal $A_n$ in response to the sequence instruction $I_n$ appearing at its input terminal. This address signal is applied to the multiplexer 52 and to the sequence RAM 46, causing the next sequence instruction $I_{n+1}$ to be read into the instruction register 48 during the clock pulse. Simultaneously, the vector information $V_{n-1}$ appearing as a data output from the stimulus RAM 28 in response to the previous address signal will be clocked into the driver register 34, to apply an appropriate current vector to the driver 32, which in turn injects a stimulus signal onto a node of the circuit under test through the test pin 36.

When the data channel functions to measure a response signal, in addition to, or rather than injecting a stimulus signal, the signal appearing at the tested node of the circuit under test is received in the receiver 38 and clocked into a measurement register 40 during a measurement clock pulse $\phi_m$. Since the address signals appearing at the output terminal of the address multiplexer 52 are always one clock pulse ahead of the vectors being applied to the circuit it is necessary to delay the address to the response RAM 30 until the response comes back from the tested circuit and is clocked into the measurement register 40. Accordingly, a suitable address delay circuit 54 can be incorporated between the output terminal of the address multiplexer 52 and the address input terminal of the response RAM 30, to delay the address signal applied to the RAM by one clock period.

The instruction from the sequence RAM 46, in addition to controlling the address output signal of the pattern controller 44, indexes the register in the vector data controller 50 to a predetermined location relating to the address of a desired variable stored in the stimulus RAM 28. The address multiplexer 52 is responsive to the sequence instructions I to selectively pass either the address output signal A of the pattern controller 44, or the register output signal RO from the vector data controller 50, as an address signal MA to the stimulus and response RAMs. Hence, in accordance with the sequence instructions stored in the sequence RAM 46, variable data stored at predetermined locations in the stimulus RAM 28 can be injected into the pattern of test vectors read out of the RAM in response to address signals produced by the pattern controller 44.

To further facilitate an understanding of the operation of the present invention, and appreciate the flexibility afforded by the use of a vector data controller as an index register to access variable data, an example of a test sequence that can be used during the testing of a 6800 microprocessor chip is set forth in Table I.

| Instruction Legend | |
|---|---|
| JZ | — JUMP TO ADDRESS ZERO, used for reset. |
| CONT | — CONTINUE, set next address from uPC. |
| PUSH | — PUSH uPC ON STK and COND. LOAD CTR |
| RFCT | — IF CTR=0, CONTINUE ELSE USE TOP OF STACK AS NEXT ADDRESS |
| CJS N | — COND. JUMP TO SUBROUTINE |
| CRTN | — COND. RETURN FROM SUBROUTINE, set next address from top of stack. |
| HALT | — HALTS EXECUTION AT END OF THIS VECTOR |

TABLE I

| Step | $I_n$ to PC44 | $A_n$ | $MA_n$ | $V_n$ | $I_{n+1}$ RAM 46 | RO | PC44 uPC | PC44 CTR | PC44 STK |
|---|---|---|---|---|---|---|---|---|---|
| 0 | JZ (RST) | 0 | 0 | V0 | CONT,R0=20 | — | — | — | — |
| 1 | CONT,R0=20 | 1 | 1 | V1 | PUSH,CT=2 | 20 | 1 | — | — |
| 2 | PUSH,CT=2 | 2 | 2 | V2 | CONT | 20 | 2 | — | — |
| 3 | CONT | 3 | 3 | V3 | CONT | 20 | 3 | 2 | 2 |
| 4 | CONT | 4 | 4 | V4 | CONT | 20 | 4 | 2 | 2 |
| 5 | CONT | 5 | 5 | V5 | RFCT | 20 | 5 | 2 | 2 |
| 6 | RFCT | 2 | 2 | V2 | CONT | 20 | 6 | 2 | 2 |
| 7 | CONT | 3 | 3 | V3 | CONT | 20 | 3 | 1 | 2 |
| 8 | CONT | 4 | 4 | V4 | CONT | 20 | 4 | 1 | 2 |
| 9 | CONT | 5 | 5 | V5 | RFCT | 20 | 5 | 1 | 2 |
| 10 | RFCT | 2 | 2 | V2 | CONT | 20 | 6 | 1 | 2 |
| 11 | CONT | 3 | 3 | V3 | CONT | 20 | 3 | 0 | 2 |
| 12 | CONT | 4 | 4 | V4 | CONT | 20 | 4 | 0 | 2 |
| 13 | CONT | 5 | 5 | V5 | RFCT | 20 | 5 | 0 | 2 |
| 14 | RFCT | 6 | 6 | V6 | CONT | 20 | 6 | 0 | 2 |
| 15 | CONT | 7 | 7 | V7 | CONT | 20 | 7 | 0 | — |
| 16 | CONT | 8 | 8 | V8 | CONT | 20 | 8 | 0 | — |
| 17 | CONT | 9 | 9 | V9 | CONT | 20 | 9 | 0 | — |
| 18 | CONT | 10 | 10 | V10 | CJS 16 | 20 | 10 | 0 | — |
| 19 | CJS 16. | 16 | 16 | V16 | CONT | 20 | 11 | 0 | — |
| 20 | CONT | 17 | 17 | V17 | CONT,A=R0,I | 20 | 17 | 0 | 11 |
| 21 | CONT,A=R0,I | 18 | 20 | V20 | CONT | 20 | 18 | 0 | 11 |
| 22 | CONT | 19 | 19 | V19 | CRTN | 21 | 19 | 0 | 11 |
| 23 | CRTN | 11 | 11 | V11 | CJS 16 | 21 | 20 | 0 | 11 |

TABLE I-continued

| Step | $I_n$ to PC44 | $A_n$ | $MA_n$ | $V_n$ | $I_{n+1}$ RAM 46 | RO | PC44 iPC | PC44 CTR | PC44 TK |
|---|---|---|---|---|---|---|---|---|---|
| 24 | CJS 16. | 16 | 16 | V16 | CONT | 21 | 12 | ) | — |
| 25 | CONT | 17 | 17 | V17 | CONT,A=R0,I | 21 | 17 | ) | - |
| 26 | CONT,A=R0,I | 18 | 21 | V21 | CONT | 21 | 18 | ) | - |
| 27 | CONT | 19 | 19 | V19 | CRTN | 22 | 19 | ) | - |
| 28 | CRTN | 12 | 12 | V12 | CJS 16 | 22 | 20 | ) | - |
| 29 | CJS 16. | 16 | 16 | V16 | CONT | 22 | 13 | ) | — |
| 30 | CONT | 17 | 17 | V17 | CONT,A=R0,I | 22 | 17 | ) | - |
| 31 | CONT,A=R0,I | 18 | 22 | V22 | CONT | 22 | 18 | ) | - |
| 32 | CONT | 19 | 19 | V19 | CRTN | 23 | 19 | ) | - |
| 33 | CRTN | 13 | 13 | V13 | CJS 16 | 23 | 20 | ) | 3 |
| 34 | CJS 16. | 16 | 16 | V16 | CONT | 23 | 14 | ) | — |
| 35 | CONT | 17 | 17 | V17 | CONT,A=R0,I | 23 | 17 | ) | 4 |
| 36 | CONT,A=R0,I | 18 | 23 | V23 | CONT | 23 | 18 | ) | 4 |
| 37 | CONT | 19 | 19 | V19 | CRTN | 24 | 19 | ) | 4 |
| 38 | CRTN | 14 | 14 | V14 | CONT | 24 | 20 | ) | 4 |
| 39 | CONT | 15 | 15 | V15 | HALT | 24 | 15 | ) | — |
| 40 | HALT | 16 | 16 | — | — | 24 | 16 | ) | — |

Table I illustrates that on the first step of a test sequence in which the system is reset, the pattern controller 44 produces an address signal A which causes an instruction signal I to be read from the sequence RAM 46. This signal instructs the pattern controller 44 to continue on to produce the next address in the sequence, i.e., 1, and set the register in the vector data controller 50 to a predetermined index location (20). During the following test step, the instruction from the sequence RAM 46 presets an internal counter within the pattern controller 44 as a prerequisite for a loop instruction to follow. The pattern controller continues to produce address signals in sequence until step 6, when it receives a loop instruction, which causes it to produce the address stored in a stack register within the pattern controller 44. The controller continues with the loop instruction, causing the same sequence of four test vectors V2-V5 to be read out of the stimulus RAM 28 for a number of times determined by the count that was preset into the internal counter by the instruction from the sequence RAM 46. After the four vector sequence is repeated two times, the pattern controller continues to produce address signals in sequence until step 19, at which point it is instructed to jump to the subroutine beginning at location 16 in the stimulus RAM 28.

Within the RAM 28, there is no vector data stored in a location corresponding to address number 18 in the subroutine. Rather, at this point in the subroutine, variable data is to be inserted into the test vector pattern. The variables are stored in the stimulus RAM 28 at address locations 20-23. Thus, at step 21, the pattern controller 44 produces address signal 18 to get its next sequence instruction, but the instruction signal from the sequence RAM 46 indicates that the address signal to be applied to the stimulus RAM is the output signal RO from the register in the vector data controller 50. Hence, in response to this instruction signal, the address multiplexer 52 applies the vector data controller signal RO to the stimulus RAM 28 to thereby cause a predetermined variable vector V20 to be inserted into the vector sequence. The instruction signal from the sequence RAM 46 also indicates that the status of the register in the data controller 50 is to be incremented, to insert a different variable the next time the subroutine is accessed, which occurs at step 24. Thus, a new variable, vector V21, is inserted into the test vector pattern at step 26.

The test procedure continues in this manner, with variables being inserted into the subroutine vector pattern as required in accordance with the status of the vector data controller 50, until the sequence RAM 46 produces an instruction to halt the procedure.

In addition to addressing the stimulus RAM 28 and the sequence RAM 46, the address signals from the pattern controller 44 can be used to provide a diagnostic function for monitoring the operation of the tester. For example, a diagnostic RAM 56 can store synchronization signals at predetermined address locations. These signals can be as simple as a single binary bit, for example. When the pattern controller 44 generates the address of one of the synchronization signals, the RAM 56 will produce an output signal at a test point 58 that is external to the tester apparatus. The appearance of the synchronization signals at the test point 58 enables an operator to ascertain that the tester is at the proper test steps during a test sequence.

The ability to insert variables into the test vector pattern is particularly advantageous in those test situations in which it is desirable to apply different stimulus signals in accordance with different responses received from the circuit under test. For example, if the response to an applied stimulus signal is the expected one, it may be desirable to continue with a predetermined test vector sequence, whereas if the response is not as expected, it may be preferable to apply a different set of vectors to assist in further defining the source of the incorrect response. In such a case, the instruction signal from the sequence RAM 46 can be a conditional instruction which directs the pattern controller 44 to generate one of two different address signals in dependence upon a measured response. The pattern controller can receive an input signal, for example from the comparator 42, that indicates whether a measured response matches an expected response. The pattern controller can then generate the proper address instruction in accordance with this signal.

Generally, it is desirable to apply the stimulus signals to the circuit under test at as fast a rate as possible, without waiting for the response to one stimulus signal before applying the next stimulus signal. Such a situation is illustrated in the timing diagram of FIG. 3, wherein the second pulse in the signal $\phi_a$, for applying the second test vector, occurs before the first pulse in the signal $\phi_m$, for measuring the response to the first vector, is terminated. However, it will be apparent that such a timing procedure cannot be utilized when the vector to be applied is conditioned upon the response to a previous vector. For example, referring to FIG. 3, if Vector 3 to be applied to the component is dependent upon the response to Vector 2, the measurement of such response must be completed before Vector 3 can be applied. Similarly, whenever a HALT instruction is issued by the sequence RAM 46, the measurement of the final applied vector must take place before the testing procedure can indeed stop, as illustrated with respect to Vector 4.

Accordingly, it is preferable to have a variable timing rate for controlling the operation of the pattern controller 44 and associated registers in the data channel. One example of a circuit for producing the variable rate is illustrated in block diagram form in FIG. 4. The timing circuit includes a timing RAM 56 containing instructions relating to the rate at which the timing signals, such as $\phi_s$ and $\phi_m$, are to be generated. These instructions can be written into the RAM 56 by the central control computer 10, for example. The instructions are fed to a suitably clocked timing register 58 which controls the generation of the timing signals accordingly. The timing instructions can also be fed to an address register 60 which determines the address of the next timing instruction signal to be read from the RAM 56.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A system for generating a sequence of test vectors, comprising:
   a first memory for storing a first set of test vectors and a second set of test vectors representing variables to be inserted in said first set of test vectors;
   a second memory for storing test pattern instructions;
   a test pattern controller responsive to the instructions stored in said second memory for addressing said first memory to access a test vector from said first set;
   a vector data controller responsive to the instructions stored in said second memory for addressing said first memory to access a test vector from said second set; and
   switching means for selectively applying address signals from said test pattern controller or said vector data controller to said first memory in accordance with instructions from said second memory.

2. The system of claim 1 further including a third memory for storing synchronization information that is accessed in response to predetermined address signals from said test pattern controller.

3. The system of claim 1 wherein said vector data controller includes a register that is indexed to a predetermined location in response to an instruction from said second memory to generate an address signal.

4. The system of claim 1 wherein said second memory is responsive to address signals generated by said test pattern controller to produce subsequent instruction signals.

5. A method of generating a sequence of test vectors, comprising the steps of:
   storing a set of test vectors;
   storing a list of variables to be inserted in said test vector;
   storing a set of test pattern instructions;
   generating a first address signal for accessing one of said test vectors in response to a stored test pattern instruction;
   generating a second address signal for accessing one of said variables; and
   selectively employing one of said first and second address signals to access one of said test vectors or said variables in response to a stored test pattern instruction.

6. The method of claim 5 further including the steps of storing a set of synchronizing signals and accessing said synchronizing signals in response to predetermined ones of said first address signals.

7. The method of claim 5 further including the step of accessing a subsequent test pattern instruction in response to said first address signal.

8. The method of claim 5 wherein said second address signal is generated in response to an accessed test pattern instruction.

9. A method of generating a pattern of test vectors, comprising the steps of:
   storing a main sequence of test vectors, a subroutine of test vectors, and a list of test vector variables in a first memory;
   storing test sequence instructions in a second memory;
   indexing a register to a location relating to the address of a predetermined one of said test vector variables;
   generating an address signal to access one of the test sequence instructions in the second memory;
   generating a vector address signal in response to the accessed test sequence instruction;
   reading a test vector from the first memory in response to the vector address signal; and
   reading a test vector from the first memory in response to the indexed location of the register when a variable vector is to inserted into the pattern of test vectors read from the memory.

10. The method of claim 9 wherein the vector address signal is applied to the second memory as the test sequence instruction address signal.

11. The method of claim 9 wherein the index location of the register is determined by the test sequence instructions stored in the second memory.

* * * * *